(12) United States Patent
Nagano

(10) Patent No.: US 6,710,667 B2
(45) Date of Patent: Mar. 23, 2004

(54) VOLTAGE CONTROLLED OSCILLATOR

(75) Inventor: Hideo Nagano, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/193,273

(22) Filed: Jul. 12, 2002

(65) Prior Publication Data

US 2003/0038683 A1 Feb. 27, 2003

(30) Foreign Application Priority Data

Aug. 27, 2001 (JP) ........................................ 2001-256602

(51) Int. Cl.$^7$ ............................................. H03B 27/00
(52) U.S. Cl. ...................... 331/57; 331/117 FE; 330/253
(58) Field of Search ........................ 331/175, 57, 117 R, 331/167, 117 FE; 330/253; 327/65, 563

(56) References Cited

U.S. PATENT DOCUMENTS 6,114,907 A * 9/2000 Sakurai ...................... 330/253
6,396,357 B1 * 5/2002 Sun et al. ...................... 331/57

FOREIGN PATENT DOCUMENTS

JP 6-85536 3/1994

OTHER PUBLICATIONS

Ian A. Young, et al., "A PLL Clock Generator with 5 to 110 MHZ of Lock Range for Microprocessors", IEEE Journal of Solid–State Circuits, vol. 27, No. 11, Nov. 1992, pp. 1599–1606, Institute of Electrical and Electronics Engineers (IEEE), New York, NY.

* cited by examiner

*Primary Examiner*—Long Nguyen
(74) *Attorney, Agent, or Firm*—Burns, Doane, Swecker & Mathis, L.L.P.

(57) ABSTRACT

Resistance elements of a differential circuit is formed of a plurality of transistors and transistors which are biased into a linear region deeper than those of other transistors and have a small transistor size are provided on a side of output point of the differential circuit, to thereby reduce a parasitic capacitance as viewed from the output point.

5 Claims, 6 Drawing Sheets

VOLTAGE CONTROLLED OSCILLATOR

BACKGROUND OF THE INVENTION

1. Field of the Invention

The present invention relates to a voltage controlled oscillator formed of a semiconductor integrated circuit having an advantage of high-speed oscillation.

2. Description of Related Art

In recent years, voltage controlled oscillators have been used in general equipment containing PLL (Phase Locked Loop) circuits, for example, used for an oscillator frequency control in automatic frequency control device, a satellite tracking receiver in signal tracking device, a frequency modulated signal demodulation device (FM receiver), a carrier regeneration control, a pulse synchronization control and a timing extraction in narrow band selecting device, multiplication frequency generation in industrial/consumer electronic equipment, and especially, a frequency synthesizer in mobile communication equipment, then the demand for them is further growing.

FIG. 10 is a circuit diagram showing a differential circuit used in a conventional voltage controlled oscillator, and FIG. 11 is an equivalent circuit diagram showing the same conventional differential circuit. In these figures, reference numeral 1 denotes a differential circuit, reference signs M1 and M2 denote PMOS transistors and reference signs M3, M4 and M5 denote NMOS transistors.

The differential circuit 1 in FIG. 10 is used for a VCO (voltage controlled oscillator) in which to achieve a high-speed oscillation frequency is required, and it is disclosed by Ian A. Young et al. ("A PLL Clock Generator with five to ten 100 MHz of Lock Range for Microprocessors" IEEE JSSC, Vol. 27, No. 11, November 1992). To sources of the transistors M1 and M2 a voltage of power supply Vcc is supplied and a bias voltage Vp is applied to gates of the transistors M1 and M2. A drain of the transistor M1 is connected to a drain of the transistor M3, and a differential output Vo+ is output from this connection point. Further, a drain of the transistor M2 is connected to a drain of the transistor M4, and a differential output Vo− is output from this connection point. A differential input Vi+ is input to a gate of the transistor M3 and a differential input Vi− is input to a gate of the transistor M4. Sources of the transistors M3 and M4 are connected to a drain of the transistor M5, a bias voltage Vn is applied to a gate of the transistor M5 and a source thereof is connected to a ground GND.

A voltage controlled oscillator consists of a plurality of differential circuits 1 which are concatenated in a ring shape and includes a voltage control unit 2 for controlling the bias voltages Vp and Vn which are applied to these differential circuits 1. One example of the voltage controlled oscillator (ring oscillator) consisting of the differential circuits 1 is shown in the equivalent circuit diagram of FIG. 12.

Next, an operation will be discussed.

The bias voltage Vp are so applied to the transistors M1 and M2 that the transistors M1 and M2 operate in a linear region to be used as resistor Rp, and the bias voltage Vn is so applied to the transistor M5 that the transistor M5 operates in a saturation region to be used as a current source. At this time, in the differential circuit 1, parasitic capacitance Cm are present at output points on the drain sides of the transistors M1 and M2 (apparently as viewed from the side of the circuit outputs). In order for the differential circuit 1 to perform a stable oscillation, the bias voltages Vp and Vn should be so set that the oscillation amplitude Vosc always satisfies the following equation (1):

$$Vosc = Itail \times Rp \qquad (1)$$

(where Itail denotes a current value of the current source transistor M5)

A differential circuit performs a more stable operation than an inverter circuit even if the oscillation amplitude is small and therefore has the advantage of high speed and low jitter. If still higher speed is required, however, when the parasitic capacitance Cm which are apparently present as viewed from the side of the output points (outputs Vo+ and Vo−) become larger, the parasitic capacitance Cm increases the transfer delay time as gate-drain feedback capacitance (mirror capacitance) to have an ill effect on the oscillation amplitude, thereby putting a limitation on an available oscillation frequency of this circuit.

SUMMARY OF THE INVENTION

The present invention is intended to solve the above described problem and it is an object of the present invention to provide a voltage controlled oscillator capable of responding to a speedup in oscillation frequency by suppressing the parasitic capacitance.

A voltage controlled oscillator according to one aspect of the present invention, it is characterized by that the resistance elements are formed of a plurality of transistors as a plurality of resistance elements connected in series to one another; and a resistance element among the resistance elements provided on a side of output point of the differential circuit are formed of transistors having a small transistor size.

A voltage controlled oscillator according to another aspect of the present invention, it is characterized by that the resistance elements include a first resistance element, a second resistance element and a third resistance element which are connected in series to one another and formed of respective transistors; the transistors forming the second and third resistance elements are biased into a linear region deeper than that of the transistor forming the first resistance element; and the third resistance element provided on the side of output point of the differential circuit is formed of transistors having a small transistor size.

DETAILED DESCRIPTION OF THE PREFERRED EMBODIMENTS

Hereafter, the preferred embodiments of the present invention will be discussed.

The First Preferred Embodiment

Figure 1:
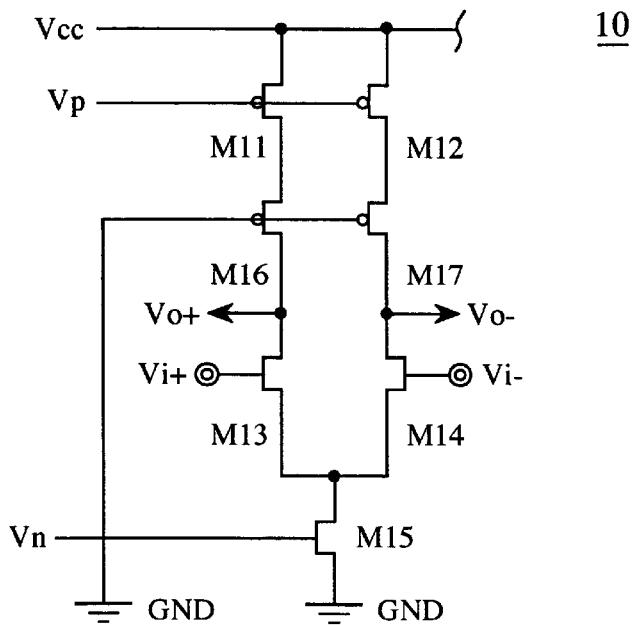
FIG. 1 is a circuit diagram showing a differential circuit which is a constituent of the voltage controlled oscillator in accordance with a first preferred embodiment of the present invention.

FIG. 1 is a circuit diagram showing a differential circuit which is a constituent of the voltage controlled oscillator in accordance with a first preferred embodiment of the present invention. In this figure, reference numeral 10 denotes a differential circuit, reference signs M11, M12, M16 and M17 denote PMOS transistors and reference signs M13, M14 and M15 denote NMOS transistors.

Sources of the transistors M11 and M12 are connected to the power supply Vcc, and the bias voltage Vp is applied to respective gates thereof. A drain of the transistor M11 is connected to a source of the transistor M16, and a drain of the transistor M12 is connected to a source of the transistor M17. Gates of the transistors M16 and M17 are connected to the ground GND. A drain of the transistor M16 is connected to a drain of the transistor M13, and this connection point serves as an output point of the differential output Vo+. A drain of the transistor M17 is connected to a drain of the transistor M14, and this connection point serves as an output point of the differential output Vo−. A gate of the transistor M13 serves as an input point of the differential input Vi+, and a gate of the transistor M14 serves as an input point of the differential input Vi−. Sources of the transistors M13 and M14 are connected to a drain of the transistor M15. The bias voltage Vn is applied to a gate of the transistor M15, and a source thereof is connected to the ground GND. Thus, the differential circuit 10 has a constitution in which the transistors M11, M16 and M13 and the transistors M12, M17 and M14 form a differential pair.

Figure 12:
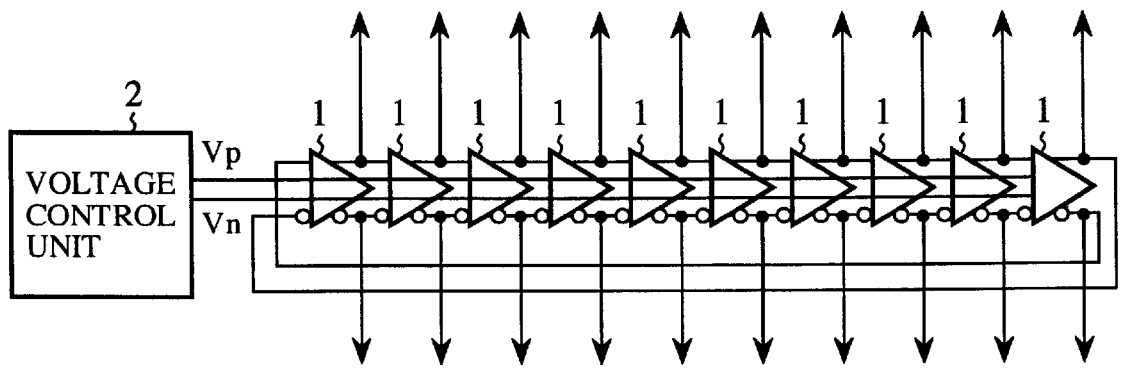
FIG. 12 is an equivalent circuit diagram showing a voltage controlled oscillator with which the differential circuits are concatenated in a ring shape.

The voltage controlled oscillator using the differential circuit 10 includes a plurality of differential circuits 10, instead of the differential circuits 1 of the voltage controlled oscillator shown in FIG. 12, whose input/output portions are multilevel-connected in a ring shape to form an oscillation loop (serving as a ring oscillator), and further includes the voltage control unit 2 for controlling the bias voltages Vp and Vn which are applied to these differential circuits 10.

Next, an operation will be discussed.

Figure 2:
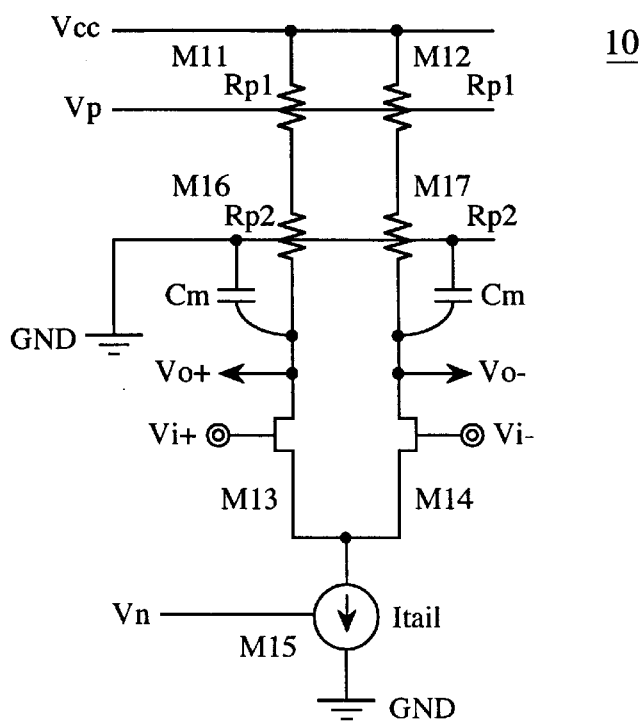
FIG. 2 is an equivalent circuit diagram showing the differential circuit in accordance with the first preferred embodiment.

FIG. 2 is an equivalent circuit diagram showing the differential circuit 10 of FIG. 1 and discussion will be made with reference to this drawing. The transistors M11 and M12, being biased into a linear region by applying the bias voltage Vp to the gates thereof, form resistor Rp1 (resistance elements). Further, the transistors M16 and M17, being biased into a linear region which is sufficiently deeper than that of the transistors M11 and M12 by connecting (short-circuiting) the gates thereof to the ground GND, form resistor Rp2 (resistance elements). The resistor Rp1 and the resistor Rp2 are connected, respectively, in series to each other, to form a differential pair in the circuit configuration.

The transistor M15, being biased into a saturation region by the bias voltage Vn, works as a current source taking a current value Itail. In the differential circuit 10, the current value Itail is decided in dependence on a set value of the bias voltage Vn, and the resistance value of the resistor Rp1 is decided in dependence on a set value of the bias voltage Vp. In order for the voltage controlled oscillator composed of the differential circuits 10 to perform a stable operation, the bias voltages Vp and Vn should be so set that the oscillation amplitude Vosc always satisfies the following equation (2):

$$Vosc = Itail \times (Rp1 + Rp2) \qquad (2)$$

(where Rp1 and Rp2 represent the respective resistance values of the resistors Rp1 and Rp2).

Since the transistors M16 and M17 are biased in the linear region sufficiently deeper than that of the transistors M11 and M12, if the transistor size of the transistors M11 and M12 is equal to that of the transistors M16 and M17, the resistance value of the resistor Rp2 becomes considerably smaller than that of the resistor Rp1. In other words, even when the transistor size of the transistors M16 and M17 is reduced to a degree, the resistor Rp2 can not have a considerably large value. When the transistor size of the transistor closer to the output point is reduced, the parasitic capacitance Cm (gate capacitance, junction capacitance at the drain) as viewed from the output point can be reduced, and by adjusting the resistance value of the resistor Rp1 in consideration of a balance with the resistor Rp2 as to ensure the required oscillation amplitude Vosc, a high-speed (high-frequency) oscillation can be achieved. When the resistance value of the resistor Rp2 becomes large by reducing the transistor size of the transistors M16 and M17, the transistor size of the transistors M11 and M12 should be so increased as to reduce the resistance value of the resistor Rp1.

Figure 3:
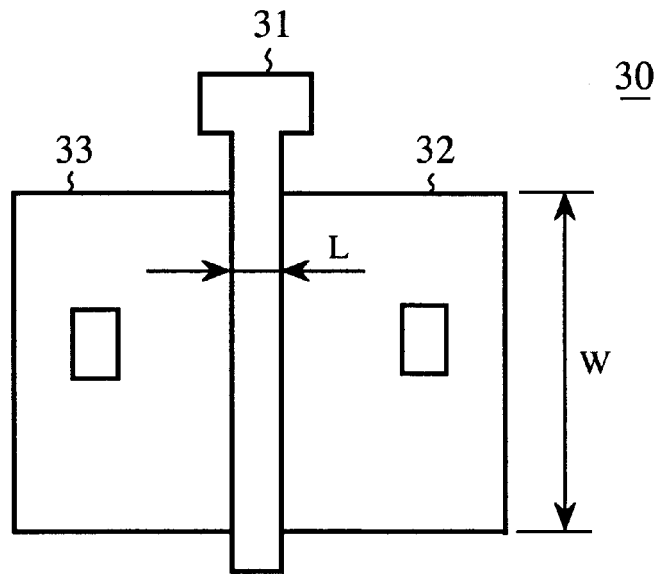
FIG. 3 is an explanatory diagram showing a schematic plan view of a MOS transistor.

The transistor size referred to in the above discussion is a gate width. FIG. 3 is an explanatory diagram showing a schematic plan view of a MOS transistor. In this figure, reference numeral 30 denotes a MOS transistor, numeral 31 denotes a gate, numeral 32 denotes a drain, numeral 33 denotes a source, reference character L denotes a gate length and reference character W denotes a gate width. Since the gate length L is fine, it is difficult to intentionally adjust the length and therefore adjustment of transistor size depends on the gate width W. When the gate width W is increased, the value of resistance between the source and drain becomes smaller, and when the gate width W is reduced, the gate capacitance and the like become smaller.

As described above according to the first preferred embodiment, since the resistance elements are formed of a plurality of transistors and the transistors having a small transistor size are provided on the side of output point of the differential circuit, the parasitic capacitance as viewed from the output point side can be reduced and this produces an effect of allowing a high-speed oscillation (oscillation of high frequency).

The Second Preferred Embodiment

The differential circuit 10 discussed in the above first preferred embodiment has a circuit configuration in which the PMOS transistors are used as resistance elements. In the second preferred embodiment, a differential circuit in which resistance elements are formed of NMOS transistors.

Figure 4:
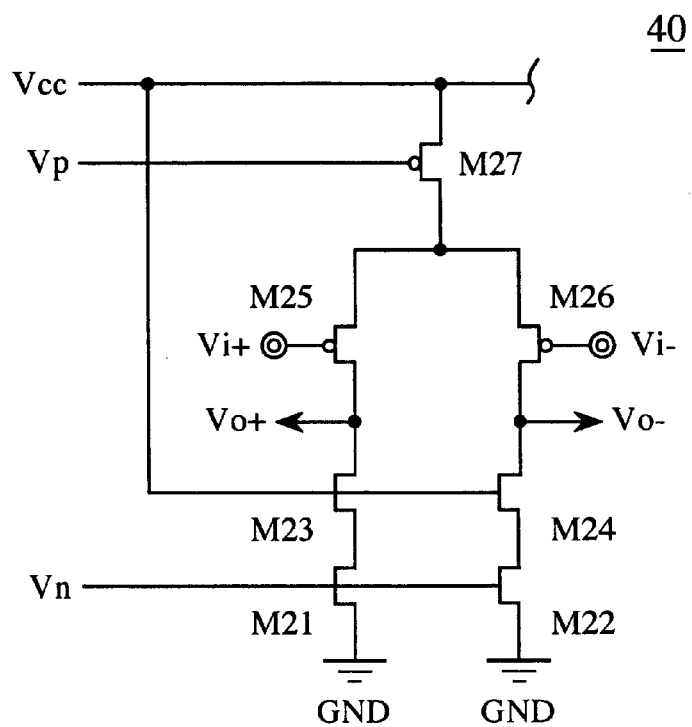
FIG. 4 is a circuit diagram showing a differential circuit which is a constituent of the voltage controlled oscillator in accordance with a second preferred embodiment of the present invention.

FIG. 4 is a circuit diagram showing a differential circuit which is a constituent of the voltage controlled oscillator in accordance with the second preferred embodiment of the present invention. In this figure, reference numeral 40 denotes a differential circuit, reference signs M21, M22, M23 and M24 denote NMOS transistors and reference signs M25, M26 and M27 denote PMOS transistors.

Sources of the transistors M21 and M22 are connected to the ground GND, and the bias voltage Vn is applied to respective gates thereof. A drain of the transistor M21 is connected to a source of the transistor M23, and a drain of the transistor M22 is connected to a source of the transistor M24. The voltage of power supply Vcc is applied to gates of the transistors M23 and M24. A drain of the transistor M23 is connected to a drain of the transistor M25, and this connection point serves as the output point of the differential output Vo+. A drain of the transistor M24 is connected to a drain of the transistor M26, and this connection point serves as the output point of the differential output Vo−. The differential input Vi+ is input to a gate of the transistor M25, and a differential input Vi− is input to a gate of the transistor M26. Sources of the transistors M25 and M26 are connected to a drain of the transistor M27. The bias voltage Vp is applied to a gate of the transistor M27, and the voltage of power supply Vcc is applied to a source thereof.

The voltage controlled oscillator using the differential circuit 40 includes a plurality of differential circuits 40, instead of the differential circuits 1 of the voltage controlled oscillator shown in FIG. 12, whose input/output portions are multilevel-connected in a ring shape to form an oscillation loop (serving as a ring oscillator), and further includes the voltage control unit 2 for controlling the bias voltages Vp and Vn which are applied to these differential circuits 40.

Next, an operation will be discussed.

Figure 5:
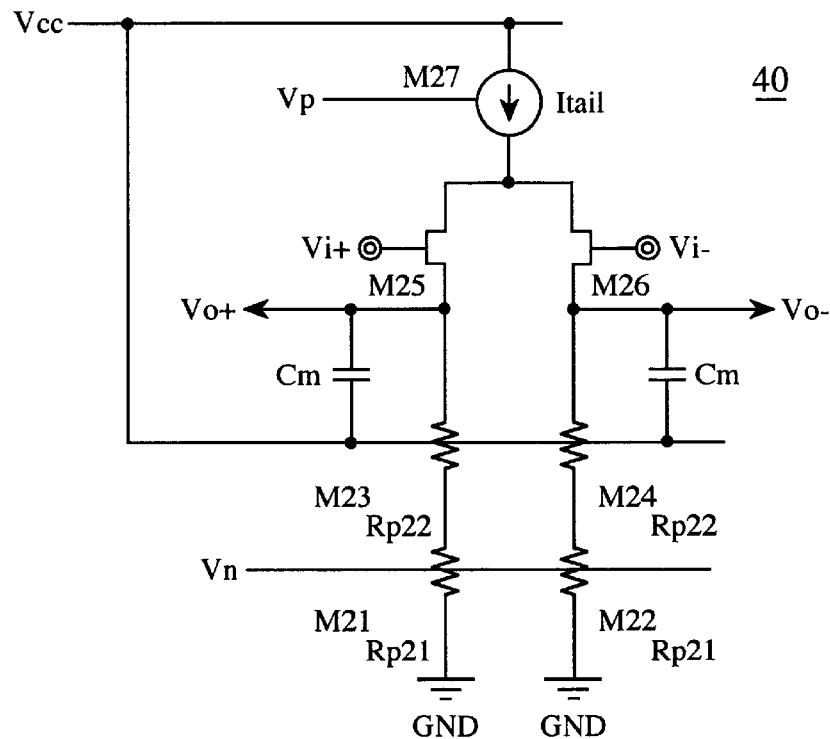
FIG. 5 is an equivalent circuit diagram showing the differential circuit in accordance with the second preferred embodiment.

FIG. 5 is an equivalent circuit diagram showing the differential circuit 40 of FIG. 4 and discussion will be made with reference to this drawing. The transistors M21 and M22, being biased into a linear region by the bias voltage Vn and operating as resistance elements, form resistor Rp21 (resistance elements). Further, the transistors M23 and M24, being biased into a linear region which is sufficiently deeper than that of the transistors M21 and M22 by applying the voltage of power supply Vcc to the gates thereof and operating as resistance elements, form resistor Rp22 (resistance elements). The resistor Rp21 and the resistor Rp22 are connected, respectively, in series to each other, to form a differential pair in the circuit configuration.

The transistor M27, being biased into a saturation region by the bias voltage Vp, works as a current source taking a current value Itail. In the differential circuit 40, the current value Itail+ depends on the set value of the bias voltage Vp and the resistance value of the resistor Rp21+ depends on a set value of the bias voltage Vn. The relation of the resistance value and the current value which are determined as above and the oscillation amplitude Vosc is expressed by the following equation (3):

$$Vosc = Itail \times (Rp21 + Rp22) \quad (3)$$

(where Rp21 and Rp22 represent the respective resistance values of the resistors Rp21 and Rp22).

Since the transistors M23 and M24 are biased into the linear region sufficiently deeper than that of the transistors M21 and M22, the transistor size of the transistors M23 and M24 can be reduced and the parasitic capacitance Cm as viewed from the output point can be thereby reduced.

As can be seen from the above discussion, the differential circuit 40 has a circuit configuration where the resistors Rp21 and Rp22 are formed of the NMOS transistors, in other words, where the NMOS transistors and the PMOS transistors in the configuration of the differential circuit 10 of the first preferred embodiment are interchanged and other circuit constituents are changed (reversed) in conformity with the polarity of the transistors, and the action and effect produced by reducing the transistor size of the transistors (transistors M23 and M24) connected in series to the transistors (transistors M21 and M22) used as the resistance elements are the same as those of the differential circuit 10.

As described above according to the first preferred embodiment, since the resistance elements are formed of a plurality of transistors and the transistors having a small transistor size are provided on the side of output point of the differential circuit, the parasitic capacitance as viewed from the output point side can be reduced and this produces an effect of allowing a high-speed oscillation (oscillation of high frequency).

Further at the same time since the resistance elements are formed of the NMOS transistors, an effect of reducing the area for circuit configuration can be produced.

The Third Preferred Embodiment

Figure 6:
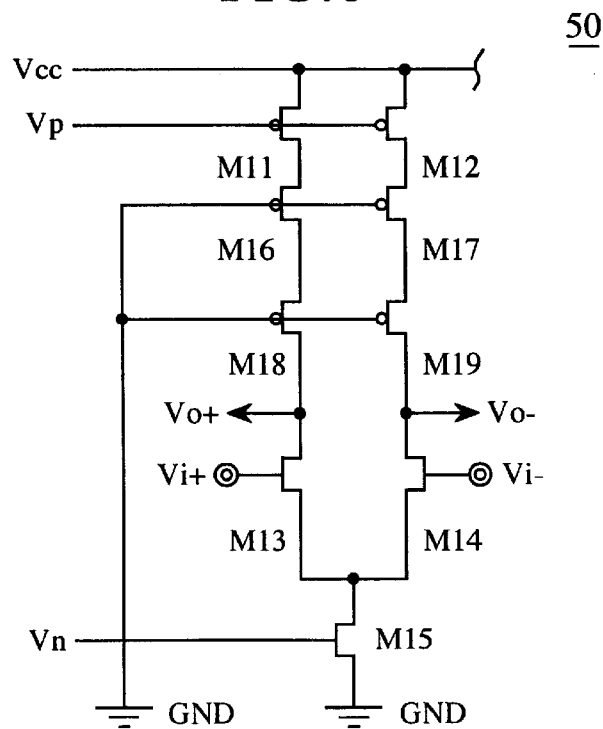
FIG. 6 is a circuit diagram showing a differential circuit which is a constituent of the voltage controlled oscillator in accordance with a third preferred embodiment of the present invention.

FIG. 6 is a circuit diagram showing a differential circuit which is a constituent of the voltage controlled oscillator in accordance with the third preferred embodiment of the present invention. The differential circuit has a circuit configuration in which transistors used for forming resistance elements are added to the differential circuit 10 discussed in the first preferred embodiment, to form a cascode connection. Constituent elements identical or corresponding to those in the differential circuit 10 are represented by the same reference signs and discussion thereof will be omitted. In this figure, reference numeral 50 denotes a differential circuit and reference signs M18 and M19 denote PMOS transistors.

A source of the transistor M18 is connected to the drain of the transistor M16, and a source of the transistor M19 is connected to the drain of the transistor M17. Gates of the transistors M18 and M19 are connected to the ground GND. A drain of the transistor M18 is connected to the drain of the transistor M13, and this connection point serves as the output point of the differential output Vo+. A drain of the transistor M19 is connected to the drain of the transistor M14, and this connection point serves as the output point of the differential output Vo−. This means that the transistor M18 is provided between the drain of the transistor M16 and the drain of the transistor M13 (on the other side of differential pair, the transistor M19 is provided between the drain of the transistor M17 and the drain of the transistor M14) in the configuration of the differential circuit 10.

A voltage controlled oscillator using the differential circuit 50 has a constitution in which the differential circuits are concatenated in a ring shape, like the voltage controlled oscillator shown in FIG. 12, and includes the voltage control unit 2 for controlling the bias voltages Vp and Vn.

Next, an operation will be discussed.

Figure 7:
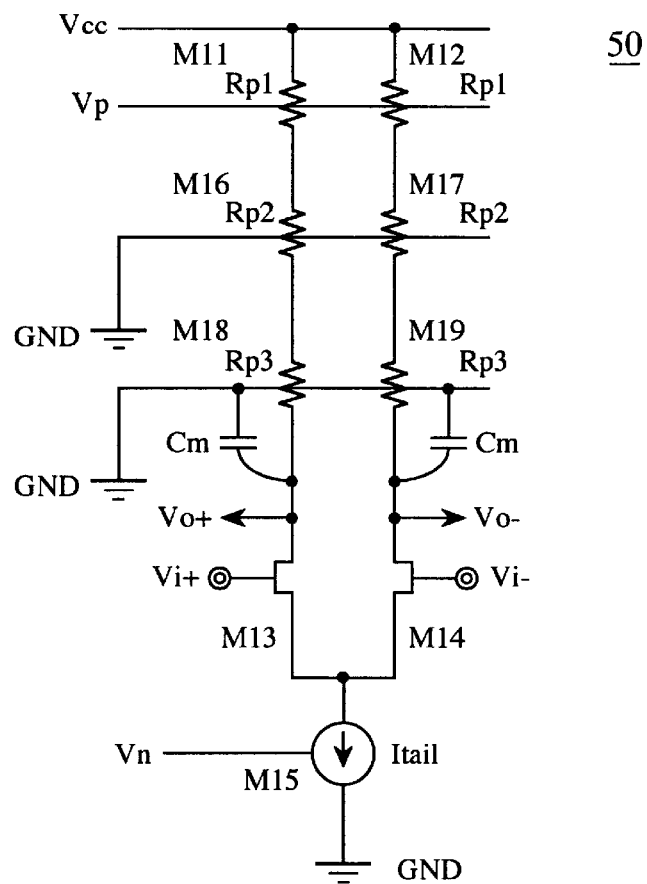
FIG. 7 is an equivalent circuit diagram showing the differential circuit in accordance with the third preferred embodiment.

FIG. 7 is an equivalent circuit diagram showing the differential circuit 50 of FIG. 6 and discussion will be made with reference to this drawing. The transistors M18 and M19, to form a resistance element, serve as resistor Rp3 (the third resistance element) in the circuit configuration. The gates of the transistors M18 and M19 are connected to the ground GND and biased into a linear region which is sufficiently deeper than that of the transistors M11 and M12 to form the resistor Rp1 (the first resistance element), like the transistors M16 and M17. Therefore, the resistor Rp3 and the resistor Rp2 (the second resistance element) have smaller resistance values in the correlation with the transistor sizes and even if the transistor sizes thereof are reduced, the resistance values thereof can not become large enough to affect the circuit configuration. The oscillation amplitude Vosc of the differential circuit 50 is expressed by the following equation (4) (the resistance value of the resistor Rp1 and the current value Itail+ depend on the bias voltages Vp and Vn, respectively, like in the first preferred embodiment):

$$Vosc = Itail \times (Rp1 + Rp2 + Rp3) \quad (4)$$

(where Rp1, Rp2 and Rp3 represent the respective resistance values of the resistors Rp1, Rp2 and Rp3).

Then, by setting the transistor size of the transistors M16 and M17 to a relatively large value (larger than that of the transistors M18 and M19) and reducing the resistance value of the resistor Rp2, the transistors M18 and M19 having a smaller transistor size (with the resistance value of the resistor Rp3 set larger) can be used (the transistor size of the transistors M16 and M17 referred to herein is not limited to such that as discussed in the first preferred embodiment). Further, because it is desirable that the resistor Rp3 should be formed of a transistor having a small transistor size, transistors having a smaller transistor size than that of the transistors M11 and M12 are used as the transistors M18 and M19. Furthermore, since the resistors Rp1, Rp2 and Rp3 are connected in series to one another in this circuit configuration, the transistors M11, M16 and M18 (M12, M17 and M19) are made to form a cascode connection and the parasitic capacitance Cm as viewed from the output point can be suppressed to a small value.

As described above according to the third preferred embodiment, since the resistance elements are formed of a plurality of transistors of cascode connection and the transistors having a small transistor size are provided on the side of output point of the differential circuit, the parasitic capacitance as viewed from the output point side can be further reduced as compared with the first and second preferred embodiments and this produces an effect of allowing a high-speed oscillation (oscillation of high frequency).

The Fourth Preferred Embodiment

Figure 8:
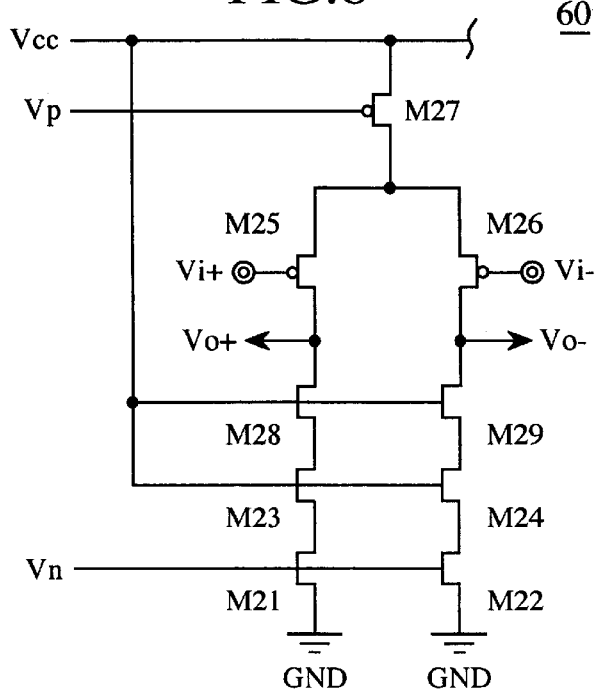
FIG. 8 is a circuit diagram showing a differential circuit which is a constituent of the voltage controlled oscillator in accordance with a fourth preferred embodiment of the present invention.

FIG. 8 is a circuit diagram showing a differential circuit which is a constituent of the voltage controlled oscillator in accordance with the fourth preferred embodiment of the present invention. The differential circuit has a circuit configuration in which transistors used for forming resistance elements are added to the differential circuit 40 discussed in the second preferred embodiment, to form a cascode connection. Constituent elements identical or corresponding to those in the differential circuit 40 are represented by the same reference signs and discussion thereof will be omitted. In this figure, reference numeral 60 denotes a differential circuit and reference signs M28 and M29 denote NMOS transistors.

A source of the transistor M28 is connected to the drain of the transistor M23, and a source of the transistor M29 is connected to the drain of the transistor M24. The voltage of power supply Vcc is applied to gates of the transistors M28 and M29. A drain of the transistor M28 is connected to the drain of the transistor M25, and this connection point serves as the output point of the differential output Vo+. A drain of the transistor M29 is connected to the drain of the transistor M26, and this connection point serves as the output point of the differential output Vo−.

A voltage controlled oscillator using the differential circuits 60 has a constitution in which the differential circuits are concatenated in a ring shape, like the voltage controlled oscillator shown in FIG. 12, and includes the voltage control unit 2 for controlling the bias voltages Vp and Vn.

Next, an operation will be discussed.

Figure 9:
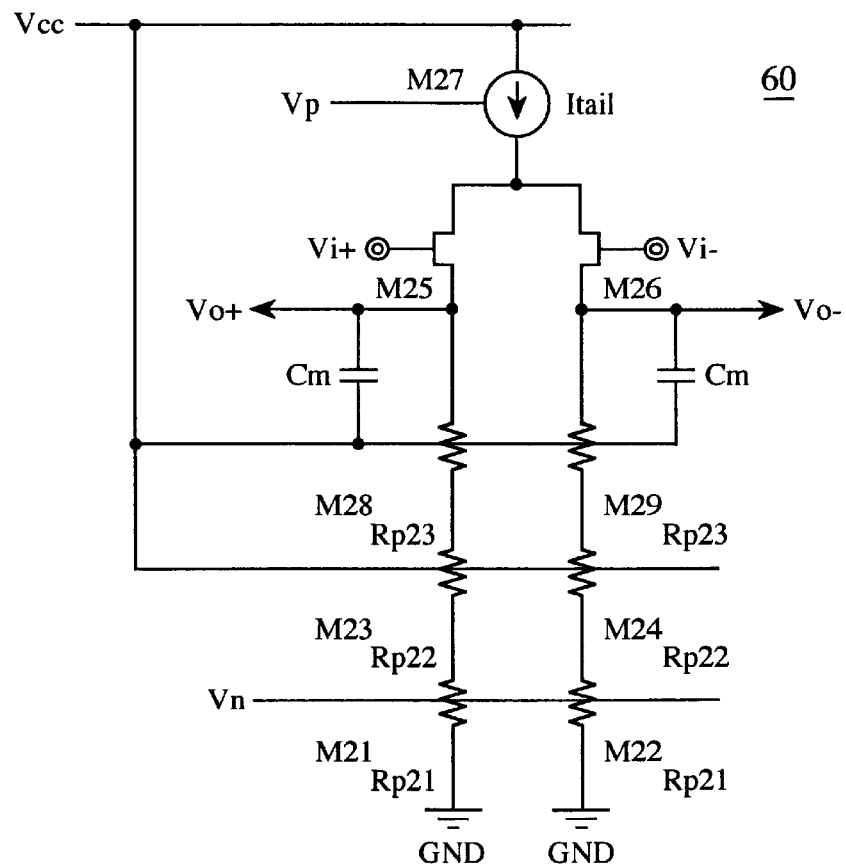
FIG. 9 is an equivalent circuit diagram showing the differential circuit in accordance with the fourth preferred embodiment.
Figure 10:
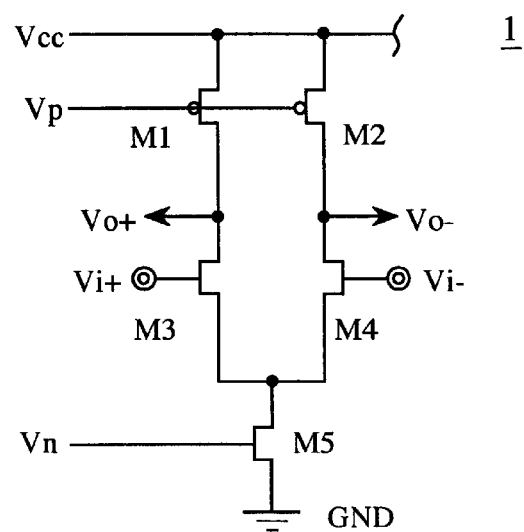
FIG. 10 is a circuit diagram showing a differential circuit of a conventional voltage controlled oscillator.
Figure 11:
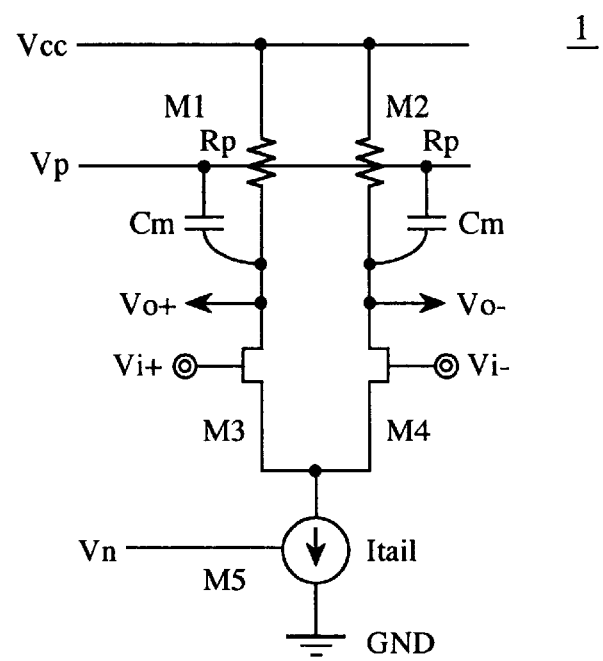
FIG. 11 is an equivalent circuit diagram showing the conventional differential circuit.

FIG. 9 is an equivalent circuit diagram showing the differential circuit 60 of FIG. 8 and discussion will be made with reference to this drawing. The transistors M28 and M29, to form resistance elements, serve as resistor Rp23 (the third resistance element) in the circuit configuration. The gates of the transistors M28 and M29 are connected to the power supply Vcc and biased into a linear region which is sufficiently deeper than that of the transistors M21 and M22 to form the resistor Rp21 (the first resistance element), like the transistors M23 and M24. Therefore, the resistor Rp23 (the third resistance element) and the resistor Rp22 (the second resistance element) have smaller resistance values in the correlation with the transistor sizes and even if the transistor sizes thereof are reduced, the resistance values thereof can not become large enough to affect the circuit configuration. The oscillation amplitude Vosc of the differential circuit 60 is expressed by the following equation (5) (the value of the resistor Rp21 and the current value Itail+ depend on the bias voltages Vn and Vp, respectively, like in the second preferred embodiment):

$$Vosc = Itail \times (Rp21 + Rp22 + Rp23) \quad (5)$$

(where Rp21, Rp22 and Rp23 represent the respective resistance values of the resistors Rp21, Rp22 and Rp23).

Then, by setting the transistor size of the transistors M23 and M24 to be larger than that of the transistors M28 and M29 and reducing the resistance value of the resistor Rp22, the transistor size of the transistors M28 and M29 is reduced (the transistor size of the transistors M23 and M24 referred to herein is not limited to such that as discussed in the second preferred embodiment). Further, because it is desirable that the resistor Rp23 should be formed of a transistor having a small transistor size, transistors having a smaller transistor size than that of the transistors M21 and M22 are used as the transistors M28 and M29. Furthermore, since the resistors Rp21, Rp22 and Rp23 are connected in series to one another in this circuit configuration, the transistors M21, M23 and M28 (M22, M24 and M29) form a cascode connection and the parasitic capacitance Cm as viewed from the output point can be suppressed to a small value.

The differential circuit 60 of the fourth preferred embodiment has a circuit configuration in which the NMOS transistors and the PMOS transistors constituting the differential circuit 50 of the third preferred embodiment are interchanged and other circuit constituents are changed in conformity with the polarity of the transistors, and the action and effect thereof are the same as those of the differential circuit 50.

As described above according to the fourth preferred embodiment, since the resistance elements are formed of a plurality of transistors of cascode connection and the transistors having a small transistor size are provided on the side of output point of the differential circuit, the parasitic capacitance as viewed from the output point side can be further reduced as compared with the first and second preferred embodiments and this produces the effect of allowing a high-speed oscillation (oscillation of high frequency).

Further, since the resistance elements are formed of the NMOS transistors, the effect of reducing the area for circuit configuration can be produced.

What is claimed is:

1. A voltage controlled oscillator comprising a plurality of differential circuits connected to one another, each of the plurality of differential circuits comprising:

a first group of transistors forming resistance elements, a second group of transistors to which a differential input is provided, the second group of transistors being connected to the first group of transistors, and a transistor forming a current source connected to the second group of transistors, wherein said first group of transistors forming resistance elements comprises a plurality of transistors connected in series to one another, and a transistor of the plurality of transistors connected in series to one another is provided at an output point of a respective differential circuit and has a transistor size smaller than that of another transistor of the plurality of transistors connected in series to one another.

2. The voltage controlled oscillator according to claim 1, wherein the transistor provided at the output point of the respective differential circuit is biased into a linear region which is deeper than that of said another transistor of the plurality of transistors connected in series to one another.

3. The voltage controlled oscillator according to claim 1, wherein the plurality of transistors connected in series to one another are NMOS transistors.

4. A voltage controlled oscillator comprising a plurality of differential circuits connected to one another, each of the plurality of the differential circuits comprising:

a first group of transistors forming resistance elements, a second group of transistors to which a differential input is provided, the second group of transistors being connected to the first group of transistors, and a transistor forming a current source connected to the second group of transistors, wherein said first group of transistors comprises a first transistor forming a resistance element, a second transistor forming a resistance element and a third transistor forming a resistance element which are connected in series to one another, said second and third transistors are biased into a linear region deeper than that of said first transistor, and said third transistor is provided at an output point of a respective differential circuit and has a transistor size smaller than that of the first and second transistors.

5. The voltage controlled oscillator according to claim 4, wherein said first, second and third transistors are NMOS transistors.

* * * * *